(12) United States Patent
Matsuda et al.

(10) Patent No.: US 10,796,033 B2
(45) Date of Patent: Oct. 6, 2020

(54) SIMULATION APPARATUS, SIMULATION METHOD, AND SIMULATION PROGRAM RELATING TO RADIATION HEAT TRANSPORT PHENOMENON

(71) Applicant: JAPAN AGENCY FOR MARINE-EARTH SCIENCE AND TECHNOLOGY, Kanagawa (JP)

(72) Inventors: Keigo Matsuda, Kanagawa (JP); Keiko Takahashi, Kanagawa (JP)

(73) Assignee: JAPAN AGENCY FOR MARINE-EARTH SCIENCE AND TECHNOLOGY, Kanagawa (JP)

( * ) Notice: Subject to any disclaimer, the term of this patent is extended or adjusted under 35 U.S.C. 154(b) by 459 days.

(21) Appl. No.: 15/036,818

(22) PCT Filed: Nov. 14, 2014

(86) PCT No.: PCT/JP2014/080197
§ 371 (c)(1),
(2) Date: May 16, 2016

(87) PCT Pub. No.: WO2015/072545
PCT Pub. Date: May 21, 2015

(65) Prior Publication Data
US 2016/0292323 A1    Oct. 6, 2016

(30) Foreign Application Priority Data

Nov. 14, 2013 (JP) .................................. 2013-236189

(51) Int. Cl.
*G06F 30/20* (2020.01)
*G01W 1/00* (2006.01)
*G06Q 50/08* (2012.01)

(52) U.S. Cl.
CPC ............... *G06F 30/20* (2020.01); *G01W 1/00* (2013.01); *G06Q 50/08* (2013.01)

(58) Field of Classification Search
CPC ..... G06F 17/5009; G01W 1/00; G06Q 50/00; G06Q 50/08
See application file for complete search history.

(56) References Cited

U.S. PATENT DOCUMENTS

2010/0305916 A1* 12/2010 Takahashi ............... G01W 1/10
703/2
2010/0305917 A1* 12/2010 Takahashi ............... G01K 7/42
703/2

FOREIGN PATENT DOCUMENTS

| JP | 2003-099697 | 4/2003 |
| JP | 2005-052045 | 3/2005 |
| JP | 2007-072991 | 3/2007 |

OTHER PUBLICATIONS

Sang-Hyun Lee • Soon-Ung Park, A Vegetated Urban Canopy Model for Meteorological and Environmental Modelling, Boundary-Layer Meteorol (2008) 126:73-102 (Year: 2008).*

(Continued)

*Primary Examiner* — Rehana Perveen
*Assistant Examiner* — Chuen-Meei Gan
(74) *Attorney, Agent, or Firm* — Marshall, Gerstein & Borun LLP

(57) ABSTRACT

A simulation apparatus for calculating unsteady spatial distributions of wind speed, temperature, etc. in a simulation target space where buildings and trees exist. The simulation apparatus calculates unsteady spatial distributions of wind speed, temperature, etc. in the simulation target space, taking into consideration the effect of the radiation heat absorbed each element and the effect of exchange of heat and water vapor between the trees and the atmosphere.

5 Claims, 5 Drawing Sheets

(56) References Cited

OTHER PUBLICATIONS

Christopher P. Loughner et al, Roles of Urban Tree Canopy and Buildings in Urban Heat Island Effects: Parameterization and Preliminary Results, Journal of Applied Meteorology and Climatology vol. 51 (Year: 2012).*
Kusaka, Hiroyuki, Hiroaki Kondo, Yokihiro Kikegawa, and Fujio Kimura. "A simple single-layer urban canopy model for atmospheric models: Comparison with multi-layer and slab models." Boundary-layer meteorology 101, No. 3 (2001): 329-358. (Year: 2001).*
Fahmy, Mohamad, Stephen Sharples, and Mahmoud Yahiya. "LAI based trees selection for mid latitude urban developments: A microclimatic study in Cairo, Egypt." Building and Environment 45, No. 2 (2010): 345-357. (Year: 2010).*
Shinzato, Paula, and Denise Duarte. "Microclinnatic effect of vegetation for different leaf area index-LAI." Passive and Low Energy Architecture, Lima (2012). (Year: 2012).*
Bruse, Michael. "ENVI-met 3.0: updated model overview." University of Bochum. Retrieved from: www. envi-met. com(2004). (Year: 2004).*
Kyaw Tha Paw U, "Mathematical Analysis of the Operative Temperature and Energy Budget", Journal of Thermal Biology, vol. 12, Issue 3, Aug. 1987, pp. 227-233.
Yoshida et al., "Development of New Plant Canopy Model for Coupled Simulation of Convection, Radiation and Moisture Transport", Seisan Kenkyu vol. 51, No. 1, 1999, pp. 11-16 with a partial translation.
Yoshida et al., "Study on Effect of Greening on Outdoor Thermal Environment Using Three Dimensional Plant Canopy Model", J. of Archi. Plann. Environ. Engng., No. 536, 2000, pp. 87-94.
Sakata et al., "CFD Simulation Technique for Urban Heat Island With Green Plant", Proceedings of the Computational Mechanics Conference, No. 17, 2004, pp. 637-638.
Sakamoto et al., "Numerical Analysis of the Cool-Spot Effect of Trees Using CFD: Part 1: Numerical Model for Radiation and Evapotranspiration of Trees", Summaries of Technical Papers of Annual Meeting Architectural Institute of Japan, D-1, 2005, pp. 689-690 with a partial translation.
Kojima et al., "Numerical Analysis of the Cool-Spot Effect of Trees Using CFD: Part 2: Case Studies of the Cool-Spot Effect", Summaries of Technical Papers of Annual Meeting Architectural Institute of Japan, D-1, 2005, pp. 691-692 with a partial translation.
Oguro et al., "Development of Heat Island Analysis and Assessment System for Buildings and Building Blocks", Report of Taisei Technology Center, No. 38, 2005, pp. 14-1-14-8, with a partial translation.
Oguro et al., "Development of Heat Island Analysis and Assessment System for Buildings and Building Blocks: Outline of the Program and Analysis Example of Future Eco-City", Report of Taisei Technology Center, No. 38, No. 42, 2009, pp. 49-1-49-8, with a partial translation.
Kataoka et al., "Development of Numerical Evaluation System for Outdoor Thermal Environment: Canopy Model for Cooling Effect by Trees", Summaries of Technical Papers of Annual Meeting Architectural Institute of Japan, D-1, 2008, pp. 927-928, with a partial translation.
Kiyoshi Sasaki, "Numerical Analyses of the Influence of Roadside Trees on Thermal Environments and Air Quality Within Street Canyon", Technical Research Report of Shimizu Construction Co., Ltd., No. 85, 2007, pp. 41-50.
Rijal et al., "Heat Island Mitigation Effect of the Large Scale Green Area Using Numerical Simulation", Seisan Kenkyu, vol. 61, No. 1, 2010, pp. 54-61, English abstract only.
Kanda et al., "Large Eddy Simulation of Organized Structure and Momentum Transfer Within and Above a Plant Canopy", Proceedings of JSCE, No. 461/II-22, 1993, pp. 39-48, English abstract only.
Shaw et al., "Large-Eddy Simulation of Turbulent Flow Above and Within a Forest", Boundary-Layer Meteorology, vol. 61, 1992, pp. 47-64.
Bohrer et al., "Exploring the Effects of Microscale Structural Heterogeneity fo Forest Canopies Using large-Eddy Simulations", Boundary-Layer Meteorology, vol. 132, 2009, pp. 351-382.
Schlegel et al., "Large-Eddy Simulation of Inhomogeneous Canopy Flows Using High Resolution Terrestrial Laser Scanning Data", Boundary-Layer Meteorology, vol. 142, 2012, pp. 223-243.
Dauzat et al., "Simulation of Leaf Transpiration and Sap flow in Virtual Plants: Model Description and Application to a Coffee Plantation in Costa Rica", Agricultural and Forest Meteorology 109, 2001, pp. 143-160.
Search Report in International Application No. PCT/JP2014/080197 dated Jan. 20, 2015, 1 page.
International Preliminary Report on Patentability and Written Opinion in International Application No. PCT/JP2014/080197 dated May 17, 2016, 5 pages.

* cited by examiner

SIMULATION APPARATUS, SIMULATION METHOD, AND SIMULATION PROGRAM RELATING TO RADIATION HEAT TRANSPORT PHENOMENON

TECHNICAL FIELD

The present invention relates to a simulation apparatus, a simulation method and a simulation program.

BACKGROUND ART

As simulation techniques for simulating temperature, etc. of an urban area, there are known the following techniques (see Patent Literature 1 and 2, and Non-Patent Literature 1-15).

Computing only radiation heat fluxes and surface temperatures taking into consideration the three-dimensional distribution of buildings and/or trees.

Computing only unsteady wind currents taking into consideration the three-dimensional distribution of buildings and/or trees.

Computing unsteady wind flows and distribution of temperature and water vapor taking into considering only the three-dimensional distribution of the building.

Computing steady wind currents and distributions of temperature and water vapor taking into consideration heat transportation between the atmosphere and buildings and/or trees.

However, the three-dimensional spatial distributions of wind speed, temperature and water vapor in the urban area where there exist trees are influenced by building wall surface temperature or the leaf surface temperature due to the effects such as radiation heat fluxes and exchange of heat and water vapor between each tree and atmosphere, and hence changes sensitively. Therefore, in the existing simulation technologies that considers only a part of those effects, spatial distribution of the unsteady speed, temperature, water vapor in the urban area cannot be suitably simulated.

CITATION LIST

Patent Literature 1: Japanese Laid-Open Patent Document No. 2003-099697

Patent Literature 2: Japanese Laid-Open Patent Document No. 2007-072991

Non-Patent Literature 1: Shinji Yoshida, Shuzo Murakami, Mochida Akashi, Ooka Ryozo, Yoshihide Tominaga, "Development of New Plant Canopy Model for Coupled Simulation of Convection, Radiation and Moisture Transport", SEISAN KENKYU Vol. 51, No. 1, 1999

Non-Patent Literature 2: Shinji Yoshida, Ryozo Ooka, Akashi Mochida, Yoshihide Tominaga, Shuzo Murakami, "Study on effect of greening on outdoor thermal environment using three dimensional plant canopy model", J. of Archi. Plann. Environ. Engng. 536, pp. 87-94, 2000

Non-Patent Literature 3: Minoru Sakata, Hirotaka Suzuki, Chunming Hsieh, "CFD Simulation Technique for Urban Heat Island with Green plant", Proceedings of the Computational Mechanics Conference, No. 17, pp. 637-638, 2004

Non-Patent Literature 4: Yuzo Sakamoto, Etsushi Kojima, Yasunobu Ashie, Masashi Imano, "Numerical Analysis of the Cool-Spot Effect of Trees Using CFD: Part 1: Numerical Model for Radiation and Evapotranspiration of Trees", Summaries of technical papers of Annual Meeting Architectural Institute of Japan, D-1, pp. 689-690, 2005

Non-Patent Literature 5: Etsushi Kojima, Yuzo Sakamoto, Yasunobu Ashie, Masashi Imano, "Numerical Analysis of the Cool-Spot Effect of Trees Using CFD: Part 2: Case Studies of the Cool-Spot Effect", Summaries of technical papers of Annual Meeting Architectural Institute of Japan, D-1, pp. 691-692, 2005

Non-Patent Literature 6: Masayuki Oguro, Yasushige Morikawa, "Development of Heat Island Analysis and Assessment System for Buildings and Building Blocks", Report of Taisei Technology Center, No. 38, pp. 14-1-14-8, 2005

Non-Patent Literature 7: Masayuki Oguro, Yasushige Morikawa, Hinako Motohashi, "Development of Heat Island Analysis and Assessment System for Buildings and Building Blocks: Outline of the Program and Analysis Example of Future Eco-City", Report of Taisei Technology Center, No. 38, No. 42, pp. 49-1-49-8, 2009

Non-Patent Literature 8: Hiroto Kataoka, Kiyotoshi Otuska, Hiroyuki Akagawa, "Development of numerical evaluation system for outdoor thermal environment: Canopy model for cooling effect by trees", Summaries of technical papers of Annual Meeting Architectural Institute of Japan, D-1, pp. 927-928, 2008

Non-Patent Literature 9: Kiyoshi Sasaki, "Numerical Analyses of the Influence of Roadside Trees on Thermal Environments and Air Quality Within Street Canyon", Technical research report of Shimizu Construction Co., Ltd., No. 85, pp. 41-50, 2007

Non-Patent Literature 10: H. B. Rijal, Ryozo Ooka et al., "Heat island mitigation effect of the large scale green area using numerical simulation", SEISAN KENKYU, Vol. 61, No. 1, 2010

Non-Patent Literature 11: Manabu Kanda, Satoshi Inagaki, Mikio Hino, "Large Eddy Simulation OF Organized Structure and Momentum Transfer Within and Above a Plant Canopy", Proceedings of JSCE, No. 461/II-22, pp. 39-48, 1993

Non-Patent Literature 12:R. H. Shaw and U. Schumann, "Large-Eddy Simulation of Turbulent Flow Above and Within a Forest", Boundary-Layer Meteorology, Vol. 61, pp. 47-64, 1992

Non-Patent Literature 13: G. Bohrer et al., "Exploring the Effects of Microscale Structural Heterogeneity of Forest Canopies Using Large-Eddy Simulations", Boundary-Layer Meteorology, Vol. 132, pp. 351-382, 2009

Non-Patent Literature 14: F. Schlegel et al., "Large-Eddy Simulation of Inhomogeneous Canopy Flows Using High Resolution Terrestrial Laser Scanning Data", Boundary-Layer Meteorology, Vol. 142, pp. 223-243, 2012

Non-Patent Literature 15: J. Dauzat et al., "Simulation of leaf transpiration and sap flow in virtual plants: model description and application to a coffee plantation in Costa Rica", Agricultural and Forest Meteorology, Vol. 109, pp. 143-160, 2001

SUMMARY OF INVENTION

Technical Problem

An object of the present invention is to provide a technique capable of accurately calculating unsteady spatial distributions of wind speed, temperature and water vapor amount in a simulation target space in which a plurality of buildings and a plurality of trees exist.

Solution to Problem

To accomplish the above object, a simulation apparatus according to one aspect of the present invention comprises:

a generation means for generating, from data representing a simulation target space in which buildings and trees exist, simulation data for treating the simulation target space as a plurality of elements, between each two elements of which radiation heat is exchanged; a view factor calculation means for calculating, based on the simulation data generated by the generation means, a view factor related to each two elements, among the plurality of elements, in consideration of their order; a first calculation means for calculating net radiation heat absorbed by each element using view factors calculated by the view factor calculation means; a second calculation means for calculating unsteady spatial distributions of wind speed, temperature and water vapor amount; a third calculation means for calculating temperature of a leaf of each tree in the simulation target space using net radiation heat absorbed by the leaf, temperature of atmosphere in space where the leaf exists, a partial pressure of the water vapor in the atmosphere, and a saturated vapor partial pressure at a surface of the leaf; and a forth calculation means for calculating, by making the first to third means function repeatedly, unsteady spatial distributions of wind speed, temperature and water vapor amount in consideration of exchange quantities of heat and water vapor between a tree canopy of each tree and the atmosphere.

Namely, the simulation apparatus of the present invention has a configuration of calculating unsteady spatial distributions of wind speed, temperature and water vapor amount in the simulation target space, taking into consideration the effect of the radiation heat absorbed each element in the simulation target space where a plurality of buildings and a plurality of trees exist and the effect of exchange of heat and water vapor between the trees and the atmosphere. Consequently, according to the simulation apparatus of the present invention, it is possible to calculate unsteady spatial distributions of wind speed, temperature and water vapor amount in a simulation target space in which a plurality of buildings and a plurality of trees exist with a high accuracy (more appropriately than the existing technologies).

The present invention can be realized as a simulation method having apparatus cooperation method including the steps corresponding to the operations performed by the unique structural units of the gateway apparatus. In addition, the present invention. Further, the present invention can be realized as a computer-readable medium in which the simulation program is stored.

Effects of the Invention

According to the present invention, it is possible to calculate unsteady spatial distributions of wind speed, temperature and water vapor amount in a simulation target space in which a plurality of buildings and a plurality of trees exist with a high accuracy.

DESCRIPTION OF THE EMBODIMENTS

A mode for carrying out the present invention will hereinafter be described with reference to the drawings. It should be noted that the following discussion of the embodiment is an example, and the present invention is not limited to the embodiment.

Figure 1:
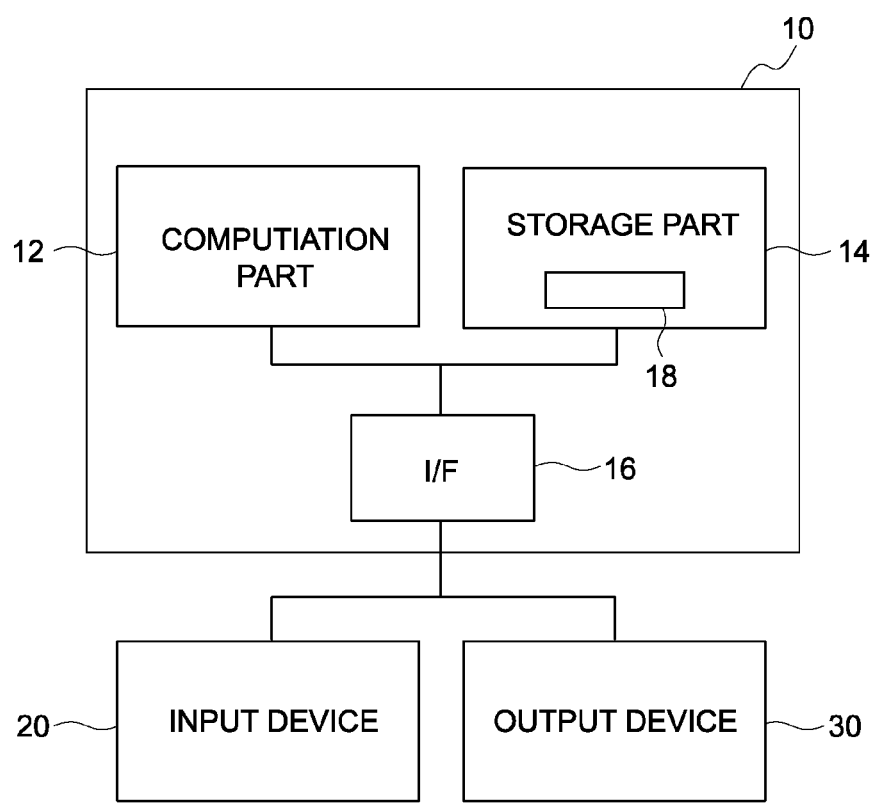
FIG. 1 is a block diagram of a simulation system according to an embodiment of the present invention.

FIG. 1 illustrates a configuration of a simulation system according to an embodiment. As illustrated, the simulation system according to the present embodiment includes a simulation apparatus 10, an input device 20 and output device 30. Further, the simulation apparatus 10 includes a computation part 12, a storage part 14, an interface circuit (I/F) 16.

The interface circuit (I/F) 16 of the simulation apparatus 10 is a circuit that is used by the computation part 12 to communicate with other devices. The storage part 14 is a nonvolatile storage device in which a simulation program 18 is stored. The storage part 14 is also used for storing data that is used by the computation part 12 and processing results by the computation part 12.

The computation part 12 is a unit in which a CPU (Central Processing Unit), a RAM (Random Access Memory), etc. are combined. This computation part 12 functions as the generating means and the first through fourth calculating means of the present invention by reading the simulation program 18 from storage part 14 and executing it, and therefore performs various processing (described in detail later).

The input device 20 is a device for inputting information into the simulation apparatus 10. The input device 20 includes one or more pointing devices such as a keyboard, a mouse, etc. Further, the output device 30 is a display, such as LCD (Liquid Crystal Display) or CRT (Cathode-Ray Tube), a printer or the like, for outputting information from the simulation apparatus 10.

Here, the simulation apparatus 10 is usually realized by making a computer (a vector-type parallel computer, etc.) which can perform matrix operation at a high speed execute the simulation program 18. Therefore, an input device and an output device of a terminal computer connected to the simulation apparatus 10 (a vector model parallel computer, or the like) usually function as the input device 20 and the output device 30.

A function of simulation apparatus 10 is now described.

The simulation apparatus 10 is for calculating unsteady spatial distributions of wind speed, temperature (atmosphere temperature, leaf surface temperature, building surface temperature, etc.), water vapor amount in a urban space including a plurality of trees (which is hereinafter referred to a simulation target space), taking into consideration exchange quantities of heat and water vapor between a canopy of each tree and the atmosphere.

Figure 2:
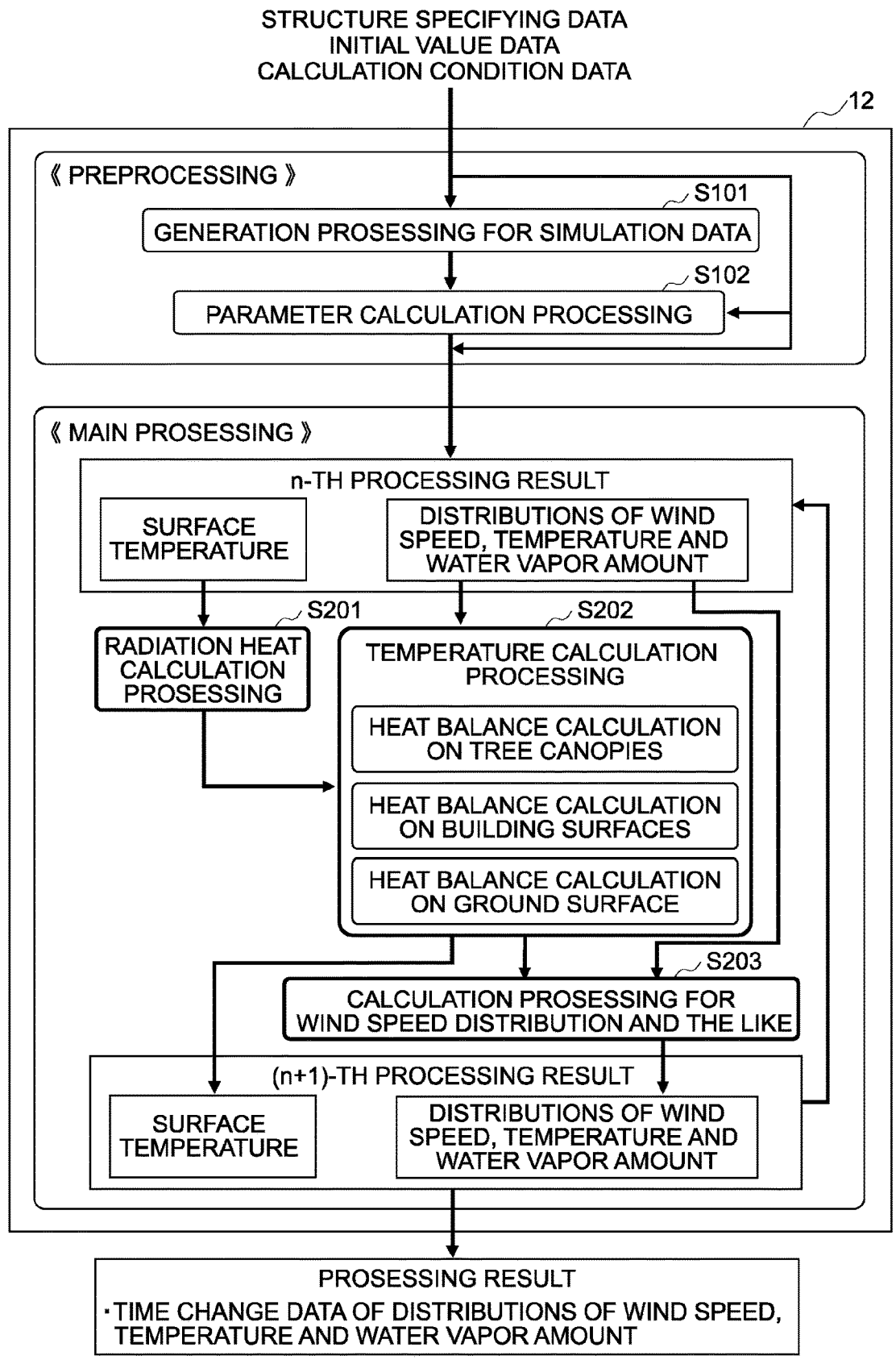
FIG. 2 is an explanatory diagram for function of the simulation system according to an embodiment of the present invention.

As schematically illustrated in FIG. 2, when using the simulation apparatus 10, structure specifying data, initial value data and calculation condition data are input into the simulation apparatus 10. Here, every data input into the simulation apparatus 10 are stored once in the storage part 14 (FIG. 1), and then read out and used by the computation part 12.

The structure specifying data input into the simulation apparatus 10 is defined as data that specifies a structure (a three-dimensional urban shape and a three-dimensional tree distribution) of the simulation target space. As the structure specifying data, data including two-dimensional plane data of heights of ground (data representing a correspondence between heights of ground points and their coordinates); two-dimensional plane data of heights of buildings (data representing a correspondence between heights of buildings and their coordinates); two-dimensional plane data of tree indexes (identifying information of the tree); and data representing the vertical distribution of the leaf area density of each tree identified by each tree index, can be used. Also, three-dimension CAD (Computer Aided Design) data containing information about leaf area density of each tree, or data including three-dimension CAD (Computer Aided Design) data that does not contain information about leaf area density of each tree and data related to leaf area density of each tree, can be used as the structure specifying data.

The initial value data is defined as data that is input into the simulation apparatus 10 in order to specify the initial values of the temperature and the water vapor amount of each portion in the simulation target space. It is possible to use, as the initial value data, data specifying the initial values of temperatures and water vapor amount in the coordinate system same as that of the structure specifying data, or data specifying the initial values of temperature and the water vapor amount for each calculation lattice/plane element/volume element (the details are described below).

The calculation condition data input into the simulation apparatus 10 is defined as data that contains various information required for simulation, such as solar direction vector information representing solar attitudes and azimuths in a simulation target time range. Here, the solar direction vector information, which is input to the simulation apparatus 10 as a component of the calculation condition information, is usually information containing the solar direction vector at each time (at each timing after an elapse of time Δt) in the simulation target time range. However, in cases where data representing latitude and longitude of each portion is input as the structure specifying data, it is possible to include into the simulation program 18 a subroutine for determining the solar direction vector from the starting date and time of the simulation target time range, latitude and longitude, in place of including such solar direction vector information into the calculation condition data.

A content of processing that the simulation apparatus 10 (the computation part 12) carries out based on the above data will be explained.

As illustrated in FIG. 2, the processing that is carried out by the computation part 12 of the simulation apparatus 10 can be classified into preprocessing and main processing.
<<Preprocessing>>

The preprocessing is defined as processing in which data generation processing for simulation data (step S101) and parameter calculation processing (step S102) are carried out in this order.
Generation Processing for Simulation Data The generation processing for simulation data which is carried out in step S101 is defined as processing of generating simulation data from input structure specifying data.

The simulation data generated by the generation processing for simulation data is for allowing the simulation target space (the three-dimensional urban space represented by the input structure specifying data) to be treated as a set of a plurality of calculation lattices (three-dimensional structure lattices) which are used in calculation processing for wind speed distribution and the like in the main processing. It should be noted that the simulation data generated by the generation processing for simulation data according to the present embodiment is data representing volume elements, each of which corresponds with one of calculation lattices, and surface elements, each of which corresponds with one surface of one calculation lattice.

The specific content (data structure) of this simulation data can be any, providing that information necessary for various calculations, which will be described later on, can be specified based on the simulation data. Accordingly, the simulation data can be, for example, the data that contains "data consisting of a serial number, a coordinate number of the corresponding calculation lattice in the simulation target space, a direction wherein the corresponding surface element is directed or a flag indicating that the corresponding element is a volume element, a flag indicating whether the corresponding element is canopy, etc." for every surface/volume element.
Parameter Calculation Processing The parameter calculation processing carried out in step S102 is defined as processing of calculating various parameters that is used in the main processing, based on the simulation data generated by data generation processing for simulation data.

The parameters calculated in the parameter calculation processing includes: view factor F related to each two elements (surface/volume elements); effective surface area $<A^{\mathit{eff}}>_k$ of each volume element k; sky factor $\omega_i$ of each element i, shadow factor $D_i$ of each surface element i, effective shadow factor $D^{\mathit{eff}}_k$ of each volume element k.

To begin with, the view factor F related to each two elements that is calculated in the parameter calculation processing will be described.

In the parameter calculation processing, for every combination of two surface elements i, j, "view factor $F_{ij}$ in viewing surface element j from surface element i" and "view factor $F_{ji}$ in viewing surface element i from surface element j" are calculated. Further, for every combination of surface element i and volume element k, "view factor $F_{ik}$ in viewing volume element k from surface element i" and "view factor $F_{ki}$ in viewing surface element i from volume element k" are calculated. Moreover, for every combination of two volume element k and l, "view factor $F_{kl}$ in viewing volume element l from volume element k" and "view factor $F_{lk}$ in viewing volume element k from volume element l" are calculated.

The "view factor $F_{ij}$ in viewing surface element j from surface element i" and "view factor $F_{ji}$ in viewing surface element i from surface element j", which are calculated in the parameter calculation processing, are the values defined by the following expressions (1) and (2), respectively.

$$F_{ij} = \frac{1}{A_i} \int_{A_i} \int_{A_j} \frac{T_{ij} \cos\beta_i \cos\beta_j}{\pi r^2} dA_i dA_j \qquad (1)$$

$$F_{ji} = \frac{1}{A_j} \int_{A_i} \int_{A_j} \frac{T_{ij} \cos\beta_i \cos\beta_j}{\pi r^2} dA_i dA_j \qquad (2)$$

Figure 3:
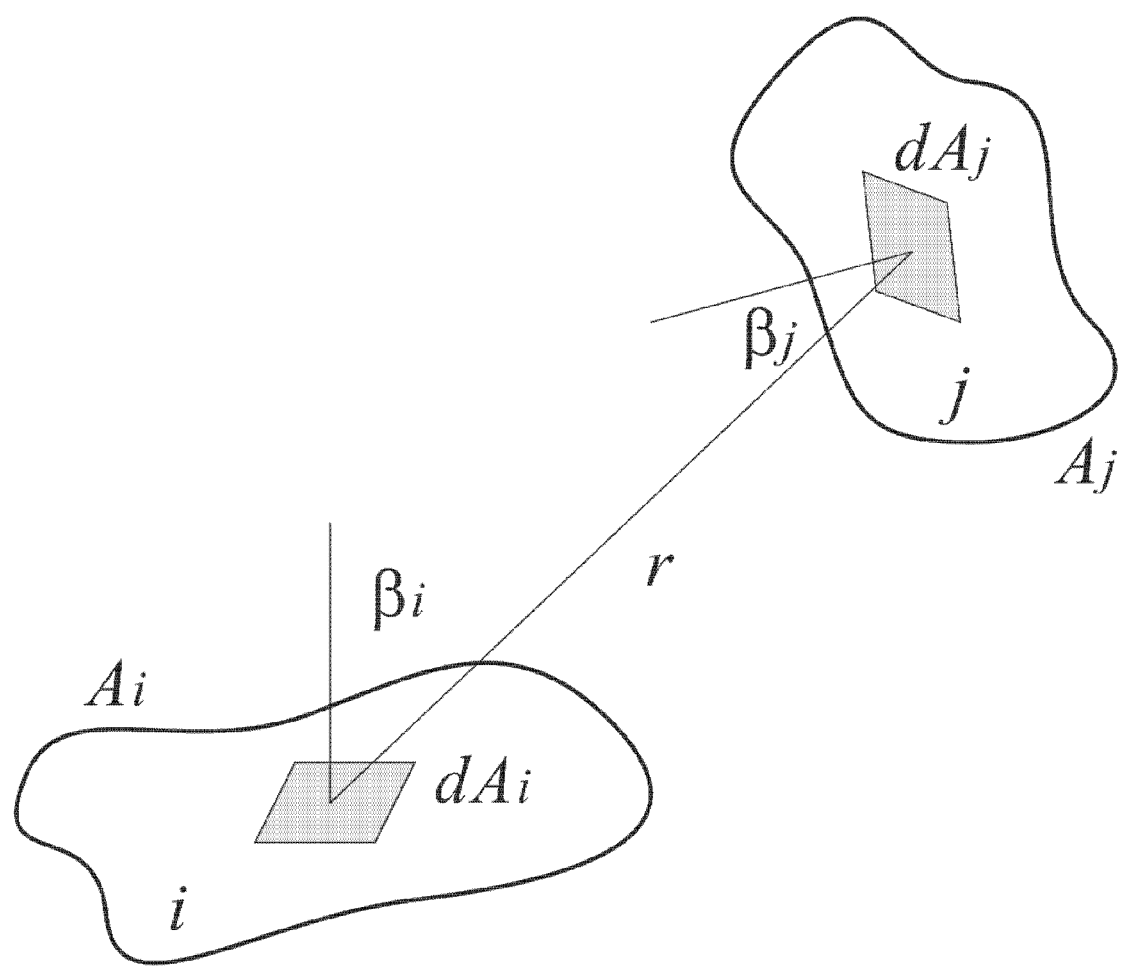
FIG. 3 is an explanatory diagram for parameters in a calculation expression for a view factor related to two surface elements.

In these expressions, $A_i$ and $A_j$ are the area of the surface element i and the area of the surface element j, respectively. As schematically illustrated in FIG. 3, $\beta i$ is the angle that a straight line connecting an infinitesimal area $dA_i$ with an infinitesimal area $dA_j$ forms with a nominal vector of the infinitesimal area $dA_i$, and $\beta j$ is the angle that the above straight line forms with a nominal vector of the infinitesimal area $dA_j$. Further, r is distance between the infinitesimal area $dA_i$ and the infinitesimal area $dA_j$.

$T_{ij}$ is permeability between the surface element i and the surface element j. $T_{ij}$ is calculated by the next expression using optical thickness $\tau_{ij}$ between two infinitesimal areas $dA_i$ and $dA_j$.

$$T_{ij} = \exp(-\tau_{ij})$$

Further, in cases where canopies are distributed between the surface element i and the surface element j (between the infinitesimal area $dA_i$ and the infinitesimal area $dA_j$), optical thickness $\tau_{ij}$ is calculated by the next expression using dispersion coefficient $k_{ext}$ of the canopy and leaf area density a.

$$\tau_{ij} = \int_0^r k_{ext} a \, dr$$

Though specific calculation procedure of view factors will be mentioned later on, the view factors that are defined by expressions (1) and (2) satisfy reciprocity relation. Namely, there exits the following relation among the view factor $F_{ij}$, the view factor $F_{ji}$, the area $A_i$ and the area $A_j$.

$$A_i F_{ij} = A_j F_{ji}$$

Consequently, it is possible to calculate the $F_{ji}$ from $F_{ij}$ calculated by the expression (1), $A_i$ and $A_j$, and it is also possible to calculate $F_{ij}$ from $F_{ji}$ calculated $F_{ij}$ by the expression (2), $A_i$ and $A_j$.

The "view factor $F_{ik}$ in viewing volume element k from the surface element i" that is calculated in the parameter calculation processing is a value defined by the following expression (3).

$$F_{ik} = \frac{1}{A_i} \int_{Ai} \int_{Ak} \frac{T_{ik}\cos\beta_i}{\pi r^2} dA_i dA_{k \leftarrow i}^{eff} \quad (3)$$

Figure 4:
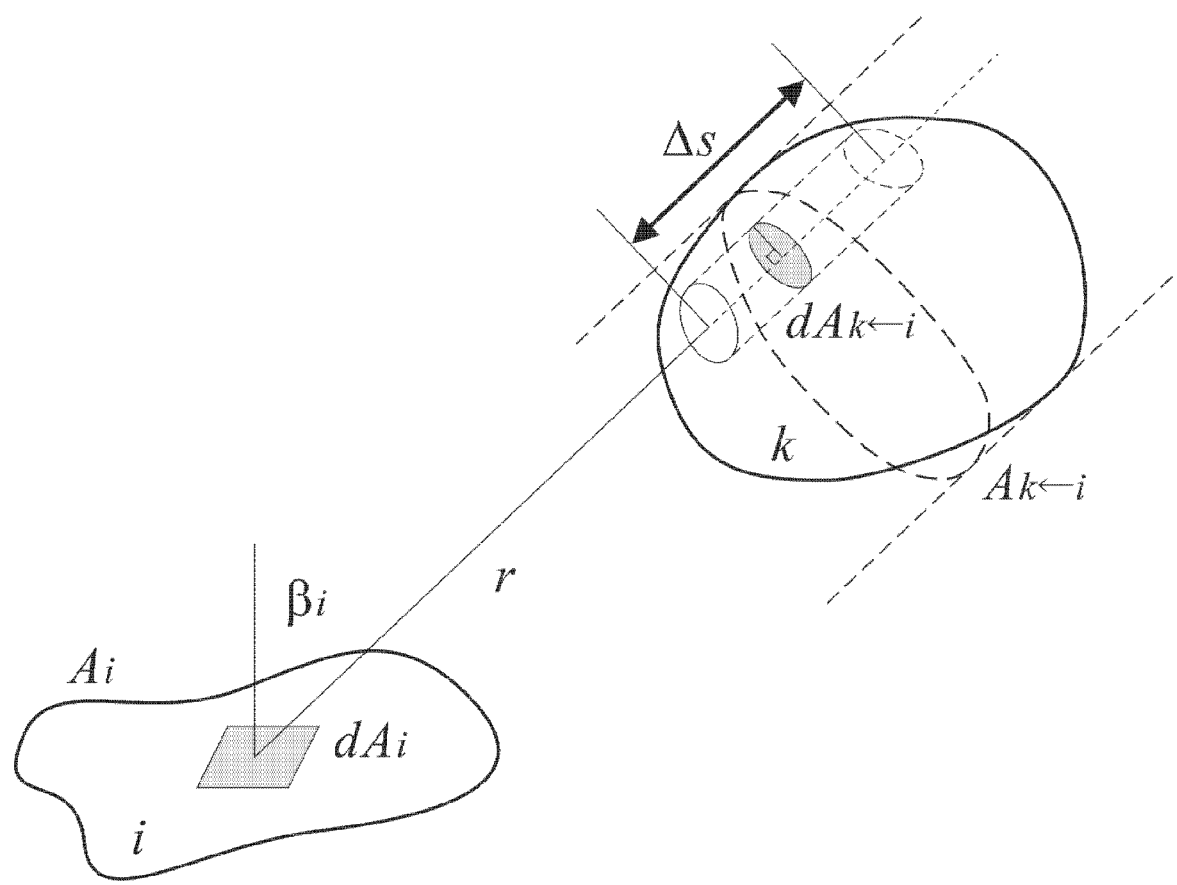
FIG. 4 is an explanatory diagram for parameters in a calculation expression of a view factor from a surface element to a volume element.

$\beta i$ in this expression (3) is, as schematically illustrated in FIG. 4, the angle that a straight line connecting an infinitesimal area $dA_i$ o the surface element $A_i$ with an infinitesimal projected area $dA_{k \leftarrow i}$ forms with a nominal vector of the infinitesimal area $dA_i$. Further, r is distance between infinitesimal area $dA_i$ and infinitesimal projected area $dA_{k \leftarrow i}$.

$A^{eff}_{k \leftarrow i}$ is an effective area of the volume element k, which is viewed from the surface element $A_i$ and is determined taking a shield factor of the volume element k itself into consideration. The $A^{eff}_{k \leftarrow i}$ is calculated by the next expression.

$$A_{k \leftarrow i}^{eff} = \int_{Ak} dA_{k \leftarrow i}^{eff} = \int_{Ak}[1 - \exp(-\Delta\tau_{k \leftarrow i})]dA_{k \leftarrow i} \quad (4)$$

Here, $\Delta\tau_{k \leftarrow i}$ is optical thickness of the volume element k in the direction perpendicular to the infinitesimal projected area $dA_{k \leftarrow i}$ (see FIG. 4). In the case where the volume element k is a tree, $\Delta\tau_{k \leftarrow i}$ is calculated by the following expression, using the dispersion coefficient $k^{ext}$, the leaf area density a and $\Delta s_{k \leftarrow i}$ which is a geometric thickness of the volume element k in the direction perpendicular to $dA_{k \leftarrow i}$.

$$\Delta\tau_{k \leftarrow i} = k_{ext} a \Delta s_{k \leftarrow i}$$

In brief, the above expression (3) is an expression that can be rearranged, using the expression (4), as follows. In the parameter processing, the view factor $F_{ik}$ in viewing the volume element k from the surface element i is calculated according to the following expression (5).

$$F_{ik} = \frac{1}{A_i} \int_{Ai} \int_{Ak} \frac{T_{ik}\cos\beta_i}{\pi r^2} [1 - \exp(-\Delta\tau_{k \leftarrow i})]dA_i dA_{k \leftarrow i} \quad (5)$$

The "View factor $F_{ki}$ in viewing surface element i from volume element k" calculated in the parameter calculation processing is a value defined by the next expression.

$$F_{ki} = \frac{1}{A_{k \leftarrow i}^{eff}} \int_{Ai} \int_{Ak} \frac{T_{ik}\cos\beta_i}{\pi r^2} [1 - \exp(-\Delta\tau_{k \leftarrow i})]dA_i dA_{k \leftarrow i} \quad (6)$$

In other words, as the view factor $F_{ki}$ in viewing the surface element i from the volume element k, a value that satisfies reciprocity relation represented by the following expression is calculated.

$$A_i F_{ik} = A_{k \leftarrow i}^{eff} F_{ki}$$

The "view factor $F_{kl}$ in viewing volume element l from volume element k" calculated in the parameter calculation processing is a value defined by the next expression.

$$F_{kl} = \frac{1}{A_{k \leftarrow l}^{eff}} \int_{Al} \int_{Ak} \frac{T_{kl}}{\pi r^2} [1 - \exp(-\Delta\tau_{l \leftarrow k})][1 - \exp(-\Delta\tau_{k \leftarrow l})]dA_{l \leftarrow k} dA_{k \leftarrow l} \quad (7)$$

That is, the view factor $F_{kl}$ is a view factor determined taking into consideration shield factor of the volume element k ("$1-\exp(-\Delta\tau_{k \leftarrow l})$"), shield factor of the volume element l ("$1-\exp(-\Delta\tau_{l \leftarrow k})$") and permeability $T_{kl}$ between the volume elements k and l.

Here, the view factors related to the volume elements represented by the expression (7), as with the view factors related to the surface elements, satisfy the following reciprocity expression.

$$A_{k \leftarrow l}^{eff} F_{kl} = A_{l \leftarrow k}^{eff} F_{lk}$$

Therefore, it is possible to calculate both of view factors related to two volume elements according to the expression (7), and it is also possible to calculate one of the view factors according to the expression (7) and to calculate the other of the view factors from the calculation result of the one of the view factors.

In the parameter calculation processing, each view factor mentioned above is calculated by the Monte Carlo method.

Namely, when calculating the view factor, processing of calculating μ and φ by the following expressions using uniform random numbers Rθ and Rφ in the range from 0 to 1 and of generating unit vectors n represented by the following expression is repeated by the number of times corresponding to the accuracy required for the view factor.

$$n = (\mu \cos\phi, \mu \sin\phi, \sqrt{1-\mu^2})$$

$$\mu^2 = R_\theta$$

$$\phi = 2\pi R_\phi$$

In other words, when calculating the view factor, processing of generating unit vectors n indicating travel directions of a large number of photons that are emitted from the surface element (or volume element) in accordance with Lambert's cosine law is performed.

Then, the view factor $F_{ij}$ is determined by integrating energy $W_p$ of every photons p that are to be incident on the element i when photons with same energy $W_0$ are emitted from the element i in the direction of every unit vector n.

Specifically, in the case where the number of the photons emitted from the surface element i is N and the number of the photons that are incident on the surface element j is n, the view factor $F_{ij}$ is calculated by the following expression.

$$F_{ij} = \frac{\sum_{p=1}^{n} W_p}{NW_0}$$

Here, in the case where there exist only the surface elements, having perfect shielding property, such as building wall surfaces, the energy $W_p$ of the photon to be incident on the surface element j agrees with $W_0$, and hence the view factor is given by $F_{ij}=n/N$. In the case where elements having radiation permeability, such as trees, are distributed in the space, the energy $W_p$ of the photon to be incident on the surface element j attenuates until arriving at the surface element j from the surface element i. Therefore the influence on the view factor due to the attenuation is taken into consideration by attenuating the energy of the photon. That is, $W_p$ is calculated by the next expression.

$$W_p = T_{ij,p} W_0$$

Here, $T_{ij,p}$ is permeability along the path of the photon p. Incidentally, it is also possible to calculate the view factor in consideration of the influence due to attenuation by decreasing the number of the photon to be incident on the surface element j based on the thinking that photons are shielded probabilistically.

The view factor $F_{ik}$ in viewing the volume element k from surface element i is a value defined as by the expression (7). Consequently, the view factor $F_{ik}$ in viewing the volume element k from the surface element i is calculated by the next expression.

$$F_{ik} = \frac{\sum_{p=1}^{n} W_p[1 - \exp(-\Delta\tau_{k \leftarrow i, p})]}{NW_0}$$

Here, $\Delta\tau_{k \leftarrow i,p}$ is optical thickness in the volume element k along the path of the photon p. N is the number of the photons emitted from the surface element i, and n is the number of the photons that are incident on the volume element k.

In the calculation of the view factor $F_{kl}$, it is assumed that photos are emitted isotropically from each point of the surfaces of the volume element. That is, a large number of photons are virtually emitted from each point of the surfaces of the volume element according to Lambert's cosine law.

Then, the view factor $F_{ki}$ in viewing the surface element i from the volume element k is calculated by the next expression.

$$A_{k \leftarrow i}^{eff} F_{ki} = \frac{\sum_{p=1}^{m} W_p[1 - \exp(-\Delta\tau_{k \leftarrow i, p})]}{(M/S_k)W_0}$$

Here, $\Delta\tau_{k \leftarrow i,p}$ is optical thickness within the volume element k which is calculated by back-tracing the photon p from its emitting point in the direction opposite to the traveling direction of the photon p. Further, $S_k$ is the surface area of the volume element k, M is the number of the photons emitted from the volume element k, and m is the number of the photons that are incident on the surface element i.

Similarly, the vie factor $F_{kl}$ in viewing the volume element l rom volume element k is calculated by the next expression.

$$A_{k \leftarrow l}^{eff} F_{kl} = \frac{\sum_{p=1}^{m} W_p[1 - \exp(-\Delta\tau_{k \leftarrow l, p})][1 - \exp(-\Delta\tau_{l \leftarrow k, p})]}{(M/S_k)W_0}$$

Here, m in this expression is the number of the photons that are incident on the volume element l when M number of photons are emitted from the volume element k.

Hereinafter, it will be described effective surface area $<A^{eff}>_k$ of each volume element k, sky rate $\overline{\omega}_i$ of each element i, shadow factor $D_i$ of each surface element i, effective shadow factor $D^{eff}_k$ of each volume element k, which are calculated in the parameter calculation processing.

The effective surface area $<A^{eff}>_k$ of each volume element k which is calculated in the parameter calculation processing is a value defined by the following expression.

$$\langle A^{eff} \rangle_k = \sum_{i=1}^{m} A_{k \leftarrow i}^{eff} F_{ki}$$

In this expression, m is the total number of the elements (surface element or volume element) which exist around the volume element k (which can be seen from the volume element k), and i (=1 to m) is the element number of the surface element or the volume element which exists around the volume element k.

In the parameter calculation processing, the effective surface area $<A^{eff}>_k$ is calculated by the following expression.

$$\langle A^{eff} \rangle_k = \frac{S_k}{M} \sum_{p=1}^{M} [1 - \exp(-\Delta\tau_{k \leftarrow p})]$$

Namely, the effective surface area $<A^{eff}>_k$ is also calculated by Monte Carlo method.

The sky factor $\omega_i$ of the element (surface element/volume element) i is a value corresponding to the view factor in viewing the sky from the element i. The sky factor $\omega_i$ is calculated by a procedure similar to the procedure for the view factor in viewing a surface element from the element i.

The shadow factor $D_i$ of the surface element i is determined by integrating energy $\Delta W_p$ that is lost when the photon p which is emitted from the surface element i to the solar side is incident on other elements. More specifically, the shade rate $D_i$ is calculated by using Monte Carlo method and the following expression. Note that, in the following expression, N is the number of photons emitted from the surface element i.

$$D_i = \frac{\sum_{p=1}^{N} \Delta W_p}{NW_0}$$

Similarly, the effective shade factor $D^{eff}_k$ of the volume element k is calculated by using Monte Carlo method and the following expression.

$$D^{eff}_k = 1 - \frac{\sum_{p=1}^{M}[1-\exp(-\Delta\tau_{k\leftarrow p})]\cos\theta}{M/S_k} + \frac{\sum_{p=1}^{M}[1-\exp(-\Delta\tau_{k\leftarrow p})]\cos\theta\Delta W_p}{(M/S_k)W_0}$$

The effective shade factor $D^{eff}_k$ and the shade factor $D_i$ are parameters of which values vary depending on the solar position. Therefore, in the parameter calculation processing, the shade factor $D_i$ and the effective shade factor $D^{eff}_k$ at each simulation time in the simulation target time range are calculated.

<<Main Processing>>

Hereinafter, a content of the main processing carried out by the computation part 12 will be described.

As schematically illustrated in FIG. 2, the main processing is processing in which radiation heat calculation processing (step S201), temperature calculation processing (step S202) and calculation processing for wind speed distribution and the like (step S203) are repeated. Here, the repetition number of the radiation heat calculation processing, etc. is determined based on the simulation target time range and the simulation time interval $\Delta t$ which are input as components of the calculation condition data.

Radiation Heat Calculation Processing

The radiation heat calculation processing which is carried out in step S201 is processing in which (1) radiation flux $G_{L,i}$ [W/m$^2$] of the longwave emission (infrared ray) is calculated by using parameters (the view factors, etc.) calculated by the parameter calculation processing and the n-th calculation result of surface temperature of each part, and (2) by using calculated radiation flux and the n-th calculation result of surface temperature of each part, net radiation heat $R_{S,i}$[W] related to the shortwave emission and net radiation heat $R_{L,i}$[W] related to the longwave emission which are absorbed by each element i are calculated.

Here, the n-th calculation result of surface temperature of each part means the initial value of surface temperature of each surface element when n=0, and it means the n-th processing result of the temperature calculation processing (surface temperature of each surface element obtained by the n-th temperature calculation processing) when n≠0.

Specifically, regarding radiation fluxes $G_{S,i}$, $G_{L,i}$ [W/m$^2$] emitted from each element i, the following expressions (8) and (9) are fulfilled, respectively.

$$\langle A^{eff}\rangle_i G_{S,i} = \alpha_{S,i}\left\{A^{eff}_{i\leftarrow Solar}S_{direct,i} + A^{eff}_{i\leftarrow sky}S_{diffuse,i} + \sum_{j=1}^{n}A^{eff}_{i\leftarrow j}F_{ij}G_{S,j}\right\} \quad (8)$$

$$\langle A^{eff}\rangle_i G_{L,i} = \langle A^{eff}\rangle_i \varepsilon_i B(T_i) + \alpha_{L,i}\left\{A^{eff}_{i\leftarrow sky}L_i + \sum_{j=1}^{n}A^{eff}_{i\leftarrow j}F_{ij}G_{L,j}\right\} \quad (9)$$

Here, n in the expressions (8) and (9) is the total number of the surface elements and the volume elements. In the case where the element i is a volume element, $\langle A^{eff}\rangle_i$ is effective surface area of the volume element i, and in the case where the element i is a surface element, it is area of the surface element i.

$\alpha_{S,i}$ and $\alpha_{L,i}$ are reflectivities of the element i for shortwave radiation and longwave radiation, respectively, and $\varepsilon_i$ is emission rate of the volume element i. $S_{direct,i}$ is direct shortwave radiation flux from the solar which is incident on element i, and $S_{diffuse,i}$ is radiation flux of atmospheric diffuse shortwave radiation which is incident on the element i. $L_i$ is radiation flux of the atmospheric longwave radiation which is incident on the element i, and $A^{eff}_{i\leftarrow Solar}$ and $A^{eff}_{i\leftarrow sky}$ are effective areas of the element i in the directions toward the solar and the sky, respectively.

$B(T_i)$ is radiation flux emitted from the element i by heat radiation. In cases where only the $G_L$, j mentioned above is calculated (where radiation fluxes related to the longwave radiation are not calculated for each wavelength range), $B(T_i)$ is calculated by the next expression using Stefan-Boltzmann constant $\sigma$.

$$B(T)=\sigma T^4$$

$S_{direct,i}$ and $S_{diffuse,i}$ are calculated by the following expressions, using the sky factor $\omega_i$ calculated by the parameter calculation processing, and the shade factor $D_i$ for the current simulation target time.

$$S_{direct,i} = c_{direct}\frac{\max[0, S\cdot n_i]}{S_z}(1-D_i)S^{\downarrow}$$

$$S_{diffuse,i} = c_{diffuse}\omega_i S^{\downarrow}$$

Here, $S^{\downarrow}$ is the solar radiation flux which is incident on horizontal plane downward, and S (=(Sx,Sy,Sz)) is solar direction vector. $n_i$ is the unit normal vector of the surface element i, and $c_{direct}$ and $c_{diffuse}$ are coefficients for separating diffuse and direct components.

$S_{direct,i}$ calculated by the above expression is $S_{direct,i}$ of the surface element i. $S_{direct,i}$ of the volume element i is calculated by a next expression, using the effective shade factor $D^{eff}_i$ for the current simulation target time, which has been calculated by the parameter calculation processing.

$$A^{eff}_{i\leftarrow solar}S_{direct,i}=c_{direct}(1-D^{eff}_i)S^{\downarrow}$$

Here, since the emission rate $\varepsilon_i$ agrees with the absorption rate of the element i, "$1-\alpha_{L,i}$" can be used as the emission rate $\varepsilon_i$.

The expressions (8) and (9) described above are fulfilled for each i from 1 to n. That is, the following two linear matrix expressions are established.

$$\begin{bmatrix} D_{11}-\langle A^{eff}\rangle_1/\alpha_{S,1} & D_{12} & \cdots & D_{1n} \\ D_{21} & D_{22}-\langle A^{eff}\rangle_2/\alpha_{S,2} & \cdots & D_{2n} \\ \vdots & \vdots & \ddots & \vdots \\ D_{n1} & D_{n2} & \cdots & D_{nn}-\langle A^{eff}\rangle_n/\alpha_{S,n} \end{bmatrix}$$

$$\begin{bmatrix} G_{S,1} \\ G_{S,2} \\ \vdots \\ G_{S,n} \end{bmatrix} = \begin{bmatrix} A^{eff}_{1\leftarrow Solar}S_{direct,1}+A^{eff}_{\leftarrow sky}S_{diffuse,1} \\ A^{eff}_{2\leftarrow Solar}S_{direct,2}+A^{eff}_{2\leftarrow sky}S_{diffuse,2} \\ \vdots \\ A^{eff}_{n\leftarrow Solar}S_{direct,n}+A^{eff}_{n\leftarrow sky}S_{diffuse,n} \end{bmatrix}$$

$$\begin{bmatrix} D_{11}-\langle A^{eff}\rangle_1/\alpha_{L,1} & D_{12} & \cdots & D_{1n} \\ D_{21} & D_{22}-\langle A^{eff}\rangle_2/\alpha_{L,2} & \cdots & D_{2n} \\ \vdots & \vdots & \ddots & \vdots \\ D_{n1} & D_{n2} & \cdots & D_{nn}-\langle A^{eff}\rangle_n/\alpha_{L,n} \end{bmatrix}$$

-continued $$\begin{bmatrix} G_{L,1} \\ G_{L,2} \\ \vdots \\ G_{L,n} \end{bmatrix} = \begin{bmatrix} \langle A^{\mathit{eff}} \rangle_1 \varepsilon_1 B(T_1)/\alpha_{L,1} + A^{\mathit{eff}}_{1 \leftarrow sky} L_1 \\ \langle A^{\mathit{eff}} \rangle_2 \varepsilon_2 B(T_2)/\alpha_{L,2} + A^{\mathit{eff}}_{2 \leftarrow sky} L_2 \\ \vdots \\ \langle A^{\mathit{eff}} \rangle_n \varepsilon_n B(T_n)/\alpha_{L,n} + A^{\mathit{eff}}_{n \leftarrow sky} L_n \end{bmatrix}$$

$$D_{ij} = A^{\mathit{eff}}_{i \leftarrow j} F_{ij} = A^{\mathit{eff}}_{j \leftarrow i} F_{ji} = D_{ji}$$

In the radiation heat calculation processing, to begin with, the radiation fluxes $G_{S,i}$ and $G_{L,i}$ emitted from each element i are calculated by solving these linear matrix expressions.

Then, in the radiation heat calculation processing, net radiation heat $R_{S,i}$[W] related to the shortwave radiation and net radiation heat $R_{L,i}$[W] related to the longwave radiation, which are absorbed by each element i, are calculated by the following expressions (10) and (11), respectively.

$$R_{S,i} = A^{\mathit{eff}}_{i \leftarrow Solar} S_{direct,i} + A^{\mathit{eff}}_{i \leftarrow sky} S_{diffuse,i} + \sum_{j=1}^{n} A^{\mathit{eff}}_{i \leftarrow j} F_{ij} G_{S,j} - \qquad (10)$$
$$\langle A^{\mathit{eff}} \rangle_i G_{S,i}$$
$$= \langle A^{\mathit{eff}} \rangle_i \{ G_{S,i}/\alpha_{S,i} - G_{S,i} \}$$

$$R_{L,i} = A^{\mathit{eff}}_{i \leftarrow sky} L_i + \sum_{j=1}^{n} A^{\mathit{eff}}_{i \leftarrow j} F_{ij} G_{L,j} - \langle A^{\mathit{eff}} \rangle_i G_{L,i} \qquad (11)$$
$$= \langle A^{\mathit{eff}} \rangle_i [\{G_{L,i} - \varepsilon_i B(T_i)\}/\alpha_{L,i} - G_{L,i}]$$

Temperature Calculation Processing

The temperature calculation processing (FIG. 2; step S202) is processing of calculating the surface temperature of each surface element (buildings, ground) in the simulation target space and the surface temperature of the volume element (leaves in the canopy) by calculating the heat balance based on the radiation heats calculated by the radiation heat calculation processing. As schematically illustrated in FIG. 2, the temperature calculation processing uses the n-th calculation result of the calculation processing of wind speed distribution and the like.

The calculation procedure of the temperature of each surface element in the temperature calculation processing is same as a general calculation procedure of the temperature by the heat balance calculation except that the radiation heats used for the heat balance calculation are calculated using the view factors that are calculated by treating each canopy as a volume element having permeability. Therefore, only the calculation procedure of the temperature of the canopies (volume elements) will be discussed.

Figure 5:
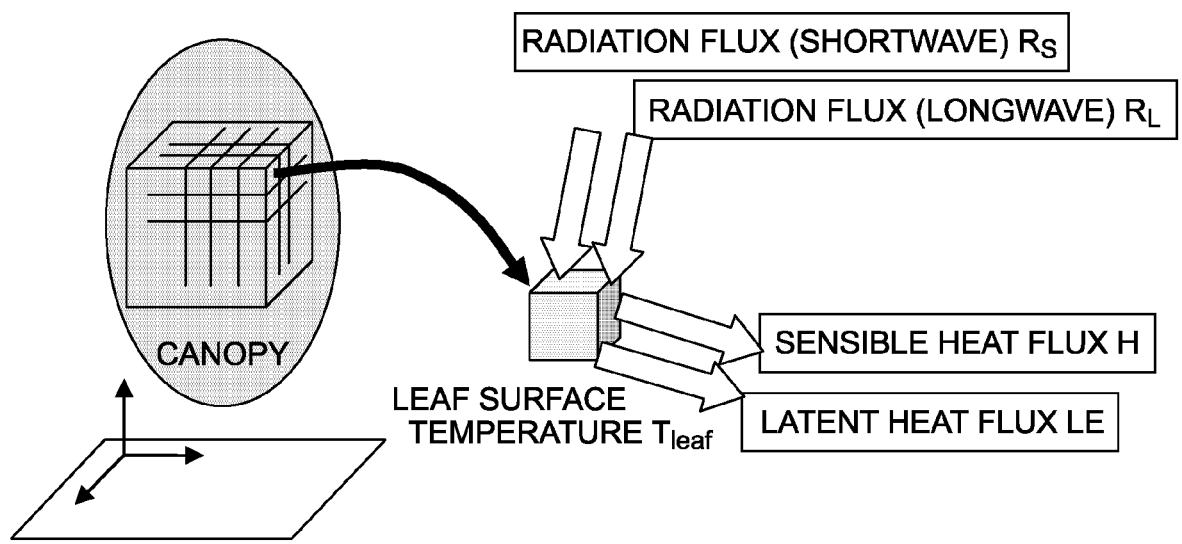
FIG. 5 is an explanatory diagram for heat balance of the volume element.

As schematically illustrated in FIG. 5, the radiation heat flux $R_S$ of the shortwave radiation and the radiation heat flux $R_L$ of the longwave flow into a volume element which is a part of the canopy, and from the volume element, the sensible heat flux H and the latent heat flux $L_E$ flow out. Therefore, the heat balance related to the volume element i, which is a canopy, is represented by the following expression.

$$Ca_i V_i \frac{dT_{leaf,i}}{dt} = R_{S,i} + R_{L,i} - H_i - LE_i$$

Here, $T_{leaf,i}$ is surface temperature [K] of the leaves in the element i, and $a_t$ is area density [m$^2$/m$^3$] of the leaves in the element i. Vi is volume [m$^3$] of element i, and C is thermal capacity [J/K/m$^2$] of the leaf per unit leaf area. $R_{S,i}$ and $R_{L,i}$ are net radiation heat (strength of the radiation heat flux) [W] of the shortwave radiation and net radiation heat [W] of the longwave radiation which are absorbed by the leaves, respectively, and L is evaporation latent heat [J/kg].

$H_i$ is sensible heat transport amount (intensity of the sensible heat flux) [W] released from the leaf to the atmosphere, and $E_i$ is water vapor amount [kg/s] transpired from the leaf to the atmosphere.

The sensible heat transport amount Hi released from the leaf to the atmosphere and the water vapor amount $E_i$ transpired from the leaf to the atmosphere are calculated by the following expressions.

$$H_i = a_i V_i K_h (T_{leaf,i} - T_{air,i})$$

$$E_i = a_i V_i \beta K_w (f_{leaf,i} - f_{air,i})$$

Here, $T_{air,i}$ is atmosphere temperature [K] in the element i, $f_{air,i}$ is water vapor partial pressure [Pa] in the atmospheric within the volume element i, $f_{leaf,i}$ is saturated water vapor partial pressure [Pa] at the leaf surface in the volume element i, $K_h$ is convection heat transfer coefficient [W/m$^2$/K], $K_w$ is convection water vapor transportation coefficient [kg/s/m$^2$/Pa], and $\beta$ is evaporation efficiency.

In the temperature calculation processing, using the leaf surface temperature and the heat flux at a certain time, the leaf surface temperature $T_{leaf,i}$ after the lapse of a time $\Delta t$ is calculated.

Specifically, taking into consideration variations of net longwave radiation, latent heat transport amount and transpiration into consideration due to the lapse of time $\Delta t$, the variation $\Delta T_{leaf,i}$ of the leaf surface temperature with the lapse of time is given by the following expression.

$$Ca_i V_i \frac{\Delta T_{leaf,i}}{\Delta t} = R_{S,i} + \left( R_{L,i} + \frac{\partial R_{L,i}}{\partial T_{leaf,i}} \Delta T_{leaf,i} \right) -$$
$$\left( H_i + \frac{\partial H_i}{\partial T_{leaf,i}} \Delta T_{leaf,i} \right) - L \left( E_i + \frac{\partial E_i}{\partial T_{leaf,i}} \Delta T_{leaf,i} \right)$$

Consequently, the leaf surface temperature variation $\Delta T_{leaf,i}$ can be calculated by the next expression.

$$\Delta T_{leaf,i} = \frac{R_{S,i} + R_{L,i} - H_i - LE_i}{\frac{Ca_i V_i}{\Delta t} - \frac{\partial R_{L,i}}{\partial T_{leaf,i}} + \frac{\partial H_i}{\partial T_{leaf,i}} + L \frac{\partial E_i}{\partial T_{leaf,i}}}$$

In the temperature calculation processing, the leaf surface temperature variation $\Delta T_{leaf,i}$ is calculated, and then $T_{leaf,i}$ (n+1) defined as the leaf surface temperature after the lapse of time $\Delta t$ is calculated by the following expression.

$$T_{leaf,i}^{(n+1)} = T_{leaf,i}^{(n)} + \Delta T_{leaf,i}$$

Calculation Processing for Wind Speed Distribution and the Like

The calculation processing for wind speed distribution and the like (FIG. 2; step S203), which is performed as element processing of the main processing, is basically processing of calculating flow speed, temperature, water vapor amount of each portion within the simulation target space at each time, by solving transport expressions for density, heat, etc. Further, the calculation processing for wind speed distribution and the like is processing of calculating flow speed, temperature, water vapor amount of each portion taking effects of resistance of the leafs in the canopies, wake production and dissipation due to the leafs into consideration.

However, in the calculation processing for wind speed distribution and the like, the tree model (see Non-Patent Literature 11) proposed by Kanda et al. is used for taking into consideration effect of resistance of the leaves in the tree canopy and effect of wake production and dissipation due to the leaves.

Hence, though the detailed explanation is omitted, in the calculation processing for wind speed distribution and the like, a motion expression in consideration of resistance of the leaves and turbulent energy balance expression at a scale smaller than the lattice scale, to which effects of wake production and dissipation due to leaves are included, the expressions being described below, are solved simultaneously.

Motion expression in consideration of resistance of the leaves $$\frac{\partial \rho u_i}{\partial t} + \frac{\partial \rho u_i u_j}{\partial x_j} = -\frac{\partial p}{\partial x_i} + \rho g_i + \frac{\partial R_{ij}}{\partial x_i} + F$$

$$F = -C_d \rho a U^2 \frac{u_i}{|U|}$$

Here, F is drag of canopy, $C_d$ is drag coefficient of leaf, a is leaf area density [m²/m³], U is scalar wind speed [m/s], $\rho$ is density [g/m³], p is pressure [Pa], $R_{ij}$: Reynolds stress of the sub-grid scale.

Turbulent energy balance expression $$\frac{\partial E}{\partial t} + u_j \frac{\partial E}{\partial x_j} = -R_{ij}\frac{\partial u_i}{\partial x_j} + \frac{\partial}{\partial x_j}\left[K_m \frac{\partial E}{\partial x_j}\right] - \frac{C_e}{\Delta}E^{\frac{3}{2}} + S$$

$$S = -2C_d a E|U| + C_w C_d a E|U|^3$$

$$R_{ij} = K_m\left[\frac{\partial u_i}{\partial x_j} + \frac{\partial u_j}{\partial x_i}\right] - \frac{2}{3}\delta_{ij}E$$

$$K_m = C_s \Delta E^{\frac{1}{2}}$$

$$\Delta = (\Delta x \Delta y \Delta z)^{\frac{1}{3}}$$

Here, E is SGS (sub-grid scale) turbulent energy [m²/s²], S is a term of wake production and energy dispersion by the canopy, $K_m$ is eddy viscosity coefficient [m²/s], $\Delta$ is characteristic length of turbulence, $C_s$ and $C_e$ are LED coefficients, $C_w$ is ratio (0-1) of the energy converted to wake production to the energy that is lost due to the drag of leaves from the flow field larger than lattice.

The computation part 12 performing the main processing outputs (stores in the storage part 14 in the present embodiment) the calculation results whenever the temperature calculation processing and the calculation processing for wind speed distribution and the like are completed. Then, the computation part 12, when the current repetition number of the temperature calculating processing, etc. is less that the repetition number determined based on the simulation target time range, performs the radiation heat calculation processing for wind speed distribution and the like again, and ends the main processing when the current repetition number of the temperature calculating processing, etc. is less that the repetition number determined based on the simulation target time range.

As described above, the simulation apparatus 10 according to the present embodiment has a configuration of calculating unsteady spatial distributions of wind speed, temperature and water vapor amount in the simulation target space, taking into consideration the effect of the radiation heat absorbed each element in the simulation target space where a plurality of buildings and a plurality of trees exist and the effect of exchange of heat and water vapor between the trees and the atmosphere. Consequently, according to the simulation apparatus of the present invention, it is possible to calculate unsteady spatial distributions of wind speed, temperature and water vapor amount in a simulation target space in which a plurality of buildings and a plurality of trees exist with a high accuracy (more appropriately than the existing technologies).

Further, the simulation apparatus 10 treats each tree canopy as one or more volume element having permeability, and calculates, as a view factor related to a surface element and a volume element (see expressions (5) and (6)), a view factor decreased by a value corresponding to a quantity of radiation heat passing through the volume element. Moreover, the simulation apparatus 10 calculates, as a view factor related to two volume elements (see expression (7)), a view factor decreased by a value corresponding to a quantity of radiation heat passing through the two volume elements. Then, the simulation apparatus 10 calculates radiation heat exchanged between each two element using calculated vie factors. Therefore, according to simulation apparatus 10, a radiation heat transportation phenomenon in the three dimension space including the canopies can be simulated in such a manner that calculation of states in each canopy is not required (in other words, computing costs can be reduced).

<<Modified Forms>>

The simulation apparatus 10 according to the embodiment described above can be modified into various forms. For example, the simulation apparatus 10 can be modified into an apparatus that does not treat the tree canopy as the volume element(s) (an apparatus that calculate radiation heat by treating surfaces of the tree canopy as surface elements). Further, the simulation apparatus 10 can be modified into an apparatus that calculates view factors without taking permeability T between two elements into consideration, and takes permeability between two elements into consideration when calculating radiation flux, etc. However, calculation of view factors in consideration of permeability T between two elements usually gives more accurate result and enables to reduce calculation cost. Therefore, it is preferable to adopt the above view factors.

Further, since the canopy thermal capacity Ca is usually very small. It is possible to modify the simulation apparatus 10 into an apparatus that calculate the leaf surface temperature using "0" as Ca. Moreover, it is possible to modify the simulation apparatus 10 into an apparatus that uses a part or all of view factors as analytical solutions of their definition expressions.

The simulation apparatus 10 is a device that calculates the leaf temperature by Euler implicit method, but the simulation apparatus 10 can be modified into an apparatus that calculates the leaf temperature by the Crank-Nicholson method, which has second-order accuracy, or the apparatus calculating the leaf temperature by an explicit method. However, since accurate values can be obtained easily by using implicit method, it is preferable to adopt implicit method to calculate the leaf temperature.

EXPLANATION OF REFERENCE NUMERALS 10 simulation apparatus
12 computation part 14 storage part
16 interface circuit

The invention claimed is:

1. A simulation apparatus, comprising
a generation means for generating, from data representing a simulation target space in which buildings and trees exist, simulation data for treating the simulation target space as a plurality of elements, between each two elements of which radiation heat is exchanged;
a view factor calculation means for calculating, based on the simulation data generated by the generation means, a view factor ($F_{kl}$) related to each pair of two elements (k, l) having corresponding surface areas ($A_k$, $A_l$) among the plurality of elements, using an effective area ($A^{eff}$) and a shield factor of each element, including an optical thickness ($\tau$) based upon a geometric thickness of each element and a permeability ($T_{kl}$) between each pair of two elements in consideration of their order and the distance (r) between the two elements, as indicated in the following equation:

$$F_{kl} = \frac{1}{A^{eff}_{k \leftarrow l}} \int_{Al} \int_{Ak} \frac{T_{kl}}{\pi r^2} [1 - \exp(-\Delta \tau_{l \leftarrow k})][1 - \exp(-\Delta \tau_{k \leftarrow l})] dA_{l \leftarrow k} dA_{k \leftarrow l}$$

a first calculation means for calculating net radiation heat absorbed by each element using view factors calculated by the view factor calculation means;
a second calculation means for calculating unsteady spatial distributions of wind speed, temperature and water vapor amount;
a third calculation means for separately calculating temperatures of a plurality of leaves associated with the trees in the simulation target space using net radiation heat absorbed by each leaf, temperature of atmosphere in space where the leaf exists, a partial pressure of the water vapor in the atmosphere, and a saturated vapor partial pressure at a surface of the leaf;
a fourth calculation means for calculating, by making the first to third means function repeatedly, unsteady spatial distributions of wind speed, temperature and water vapor amount in consideration of exchange quantities of heat and water vapor between a separate tree canopy of each tree and the atmosphere; and
a simulation means for simulating an urban environment using the calculated unsteady spatial distributions of wind speed, temperature and water vapor amount.

2. The simulation apparatus according to claim 1, wherein the third calculation means calculates the temperatures of the plurality of leaves associated with the trees by an implicit method.

3. The simulation apparatus according to claim 1, wherein the generation means generates the simulation data for treating tree canopies of the trees as volume elements; and
the view factor calculation means calculates, as a view factor of two elements including one or two volume elements, a view factor decreased by a value corresponding to a quantity of radiation heat passing through the one or two volume elements.

4. A method executed by a computer, comprising:
generation processing of generating, from data representing a simulation target space in which buildings and trees exist, simulation data for treating the simulation target space as a plurality of elements, between each two elements of which radiation heat is exchanged;
view factor calculation processing of calculating, based on the simulation data generated by the generation processing, a view factor ($F_{kl}$) related to each pair of two elements (k, l) having corresponding surface areas ($A_k$, $A_l$) among the plurality of elements using an effective area ($A^{eff}$) and a shield factor of each element, including an optical thickness ($\tau$) based upon a geometric thickness of each volume element and a permeability ($T_{kl}$) between each pair of two elements in consideration of their order and the distance (r) between the two elements, as indicated in the following equation:

$$F_{kl} = \frac{1}{A^{eff}_{k \leftarrow l}} \int_{Al} \int_{Ak} \frac{T_{kl}}{\pi r^2} [1 - \exp(-\Delta \tau_{l \leftarrow k})][1 - \exp(-\Delta \tau_{k \leftarrow l})] dA_{l \leftarrow k} dA_{k \leftarrow l}$$

main processing including a first calculation processing of calculating net radiation heat absorbed by each element using view factors calculated by the view factor calculation processing, a second calculation processing of calculating unsteady spatial distributions of wind speed, temperature and water vapor amount, and a third calculation processing of separately calculating temperatures of a plurality of leaves associated with the trees in the simulation target space using net radiation heat absorbed by each leaf, temperature of atmosphere in space where the leaf exists, a partial pressure of the water vapor in the atmosphere and a saturated vapor partial pressure at a surface of the leaf, the main processing repeating the first to third processing function so that unsteady spatial distributions of wind speed, temperature and water vapor amount in consideration of exchange quantities of heat and water vapor between a separate tree canopy of each tree and the atmosphere are calculated; and
simulation processing of simulating an urban environment using the calculated unsteady spatial distributions of wind speed, temperature and water vapor amount.

5. A non-transitory computer readable medium stored with a simulation program, the program making a computer perform:
generation processing of generating, from data representing a simulation target space in which buildings and trees exist, simulation data for treating the simulation target space as a plurality of elements, between each two elements of which radiation heat is exchanged;
view factor calculation processing of calculating, based on the simulation data generated by the generation processing, a view factor ($F_{kl}$) related to each pair of two elements (k, l) having corresponding surface areas ($A_k$, $A_l$) among the plurality of elements using an effective area ($A^{eff}$) and a shield factor of each element, including an optical thickness ($\tau$) based upon a geometric thickness of each volume element and a permeability ($T_{kl}$) between each pair of two elements in consideration of their order and the distance (r) between the two elements, as indicated in the following equation:

$$F_{kl} = \frac{1}{A^{eff}_{k \leftarrow l}} \int_{Al} \int_{Ak} \frac{T_{kl}}{\pi r^2} [1 - \exp(-\Delta \tau_{l \leftarrow k})][1 - \exp(-\Delta \tau_{k \leftarrow l})] dA_{l \leftarrow k} dA_{k \leftarrow l}$$

main processing including a first calculation processing of calculating net radiation heat absorbed by each element using view factors calculated by the view factor calculation processing, a second calculation processing of calculating unsteady spatial distributions of wind speed, temperature and water vapor amount, and a third calculation processing of separately calculating temperatures of a plurality of leaves associated with the trees in the simulation target space using net radiation heat absorbed by each leaf, temperature of atmosphere in space where the leaf exists, a partial pressure of the water vapor in the atmosphere and a saturated vapor partial pressure at a surface of the leaf, the main processing repeating the first to third processing function so that unsteady spatial distributions of wind speed, temperature and water vapor amount in consideration of exchange quantities of heat and water vapor between a separate tree canopy of each tree and the atmosphere are calculated; and simulation processing of simulating an urban environment using the calculated unsteady spatial distributions of wind speed, temperature and water vapor amount.

\* \* \* \* \*